(12) United States Patent
Tran et al.

(10) Patent No.: US 7,679,383 B2
(45) Date of Patent: Mar. 16, 2010

(54) CANTILEVER PROBE CARD

(75) Inventors: Lich Thanh Tran, San Jose, CA (US); Son N. Dang, Tempe, AZ (US); Gerald W. Back, Gilbert, AZ (US); Reynaldo M. Rincon, Richardson, TX (US)

(73) Assignee: SV Probe Pte. Ltd., Singapore (SG)

( * ) Notice: Subject to any disclaimer, the term of this patent is extended or adjusted under 35 U.S.C. 154(b) by 0 days.

(21) Appl. No.: 11/712,733

(22) Filed: Feb. 28, 2007

(65) Prior Publication Data

US 2008/0204062 A1 Aug. 28, 2008

(51) Int. Cl.
*G01R 31/02* (2006.01)
(52) U.S. Cl. .................................. 324/754; 324/762
(58) Field of Classification Search ................. None
See application file for complete search history.

(56) References Cited

U.S. PATENT DOCUMENTS

| | | | |
|---|---|---|---|
| 3,613,001 A * | 10/1971 | Hostetter | 324/762 |
| 6,713,374 B2 * | 3/2004 | Eldridge et al. | 438/611 |
| 6,771,084 B2 * | 8/2004 | Di Stefano | 324/754 |
| 7,301,354 B2 * | 11/2007 | Crippa et al. | 324/754 |
| 2005/0212539 A1 * | 9/2005 | Chen et al. | 324/754 |
| 2008/0074132 A1 * | 3/2008 | Fan et al. | 324/762 |

* cited by examiner

*Primary Examiner*—Minh N Tang
(74) *Attorney, Agent, or Firm*—Hickman Palermo Truong & Becker LLP

(57) ABSTRACT

A method and apparatus for a flattened probe element wire is provided. A probe element wire includes a beam portion and a tip portion. At least a part of the tip portion is flattened. Flattened probe element wires may have greater z-direction height strength, thereby increasing maximum probe element wire z-direction vertical force. Flattened probe element wires may also have decreased variability in the flattened probe element wire tips. A probe card assembly may includes a substrate and a plurality of at least partially flattened probe element wires supported by the substrate. Such probe card assemblies may have an extended life and maintained within design parameters for a longer period of use.

22 Claims, 16 Drawing Sheets

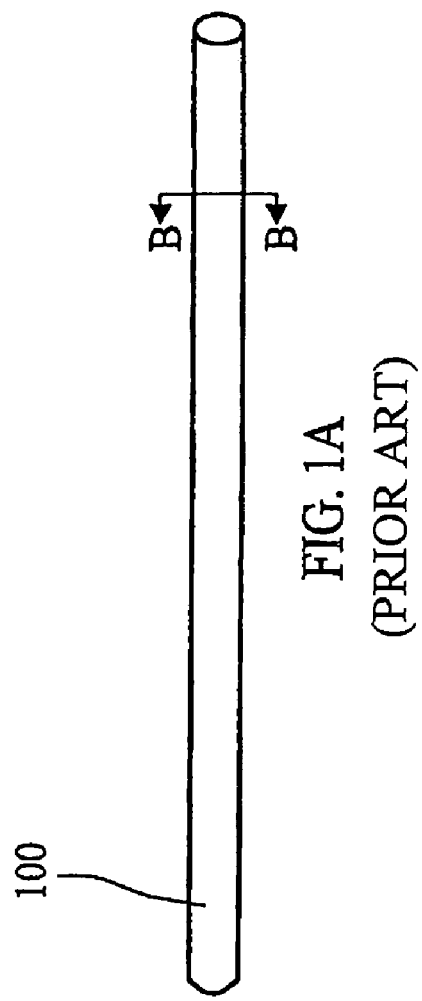
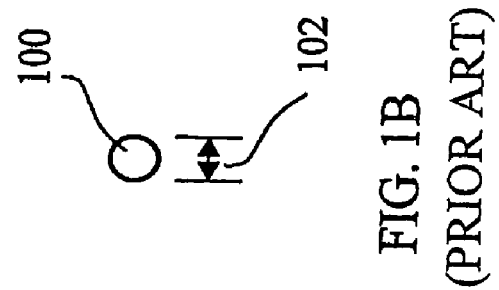
FIG. 1A (PRIOR ART)
FIG. 1B (PRIOR ART)

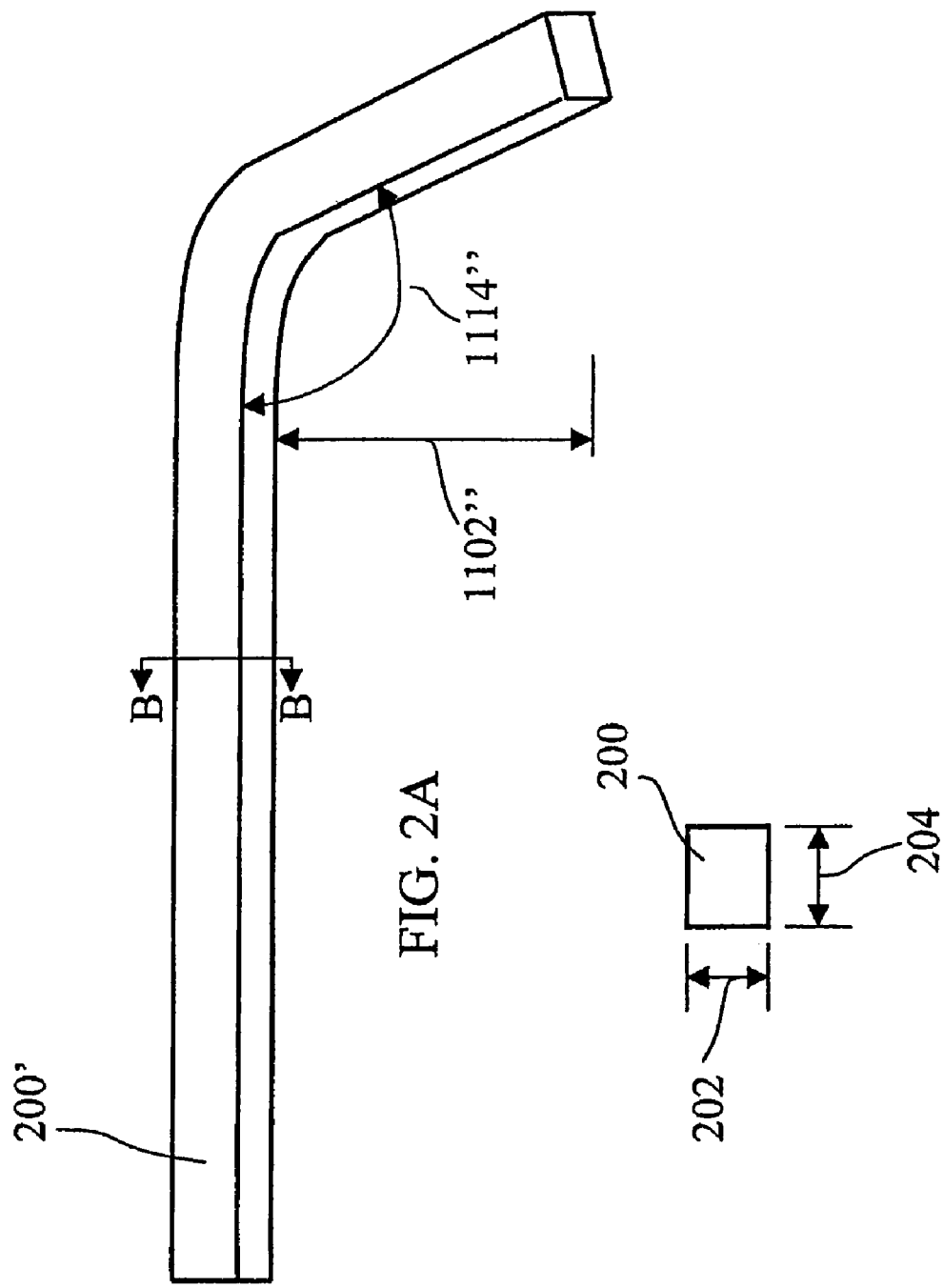

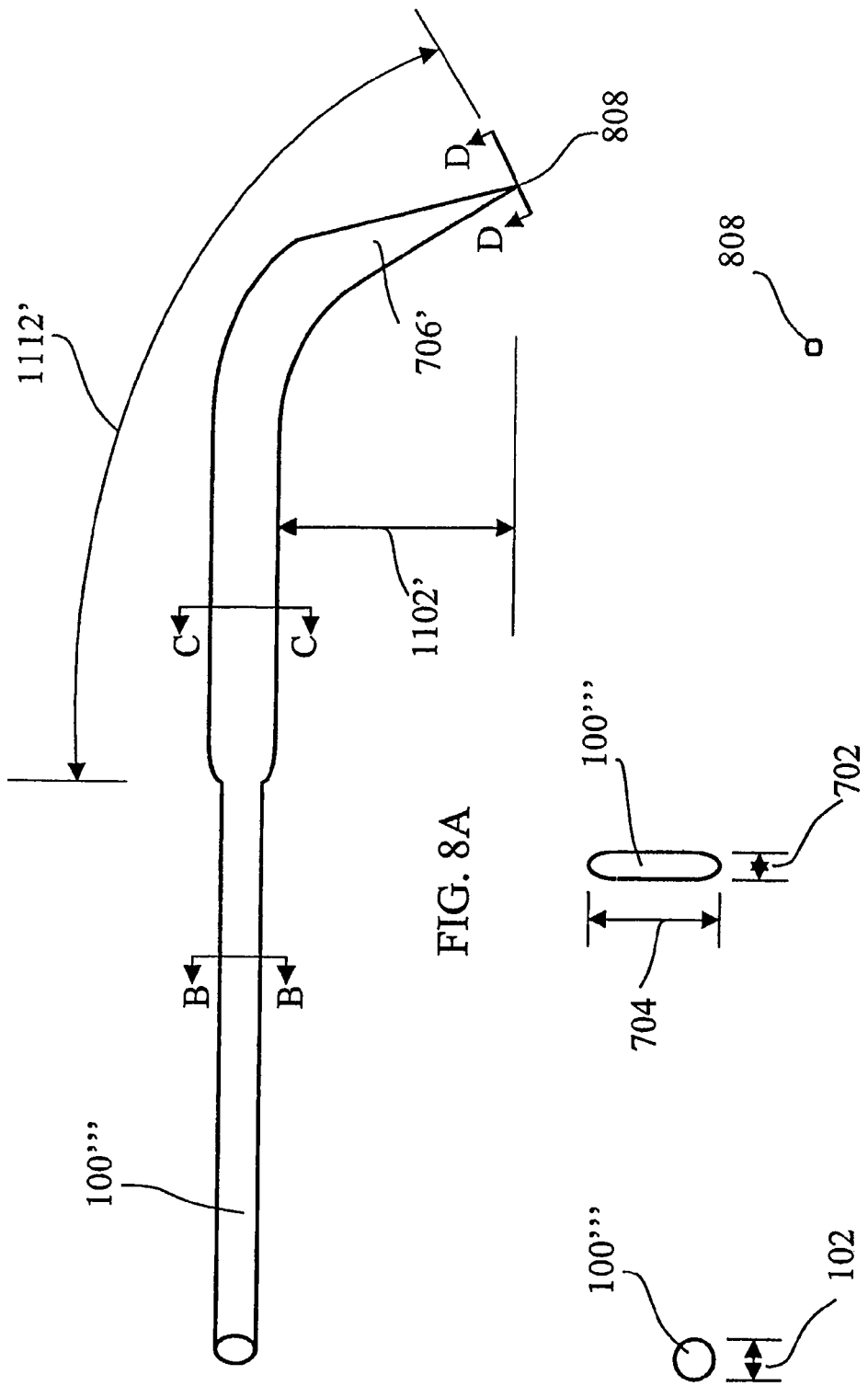

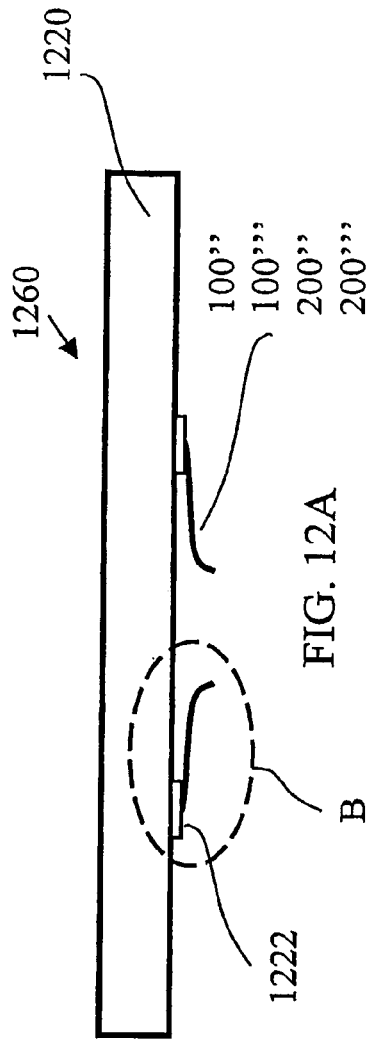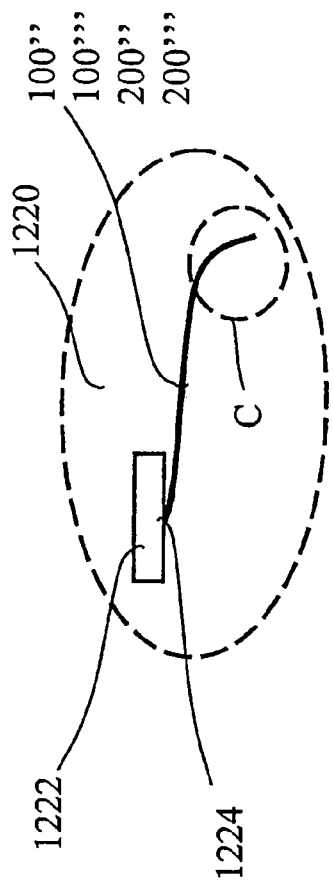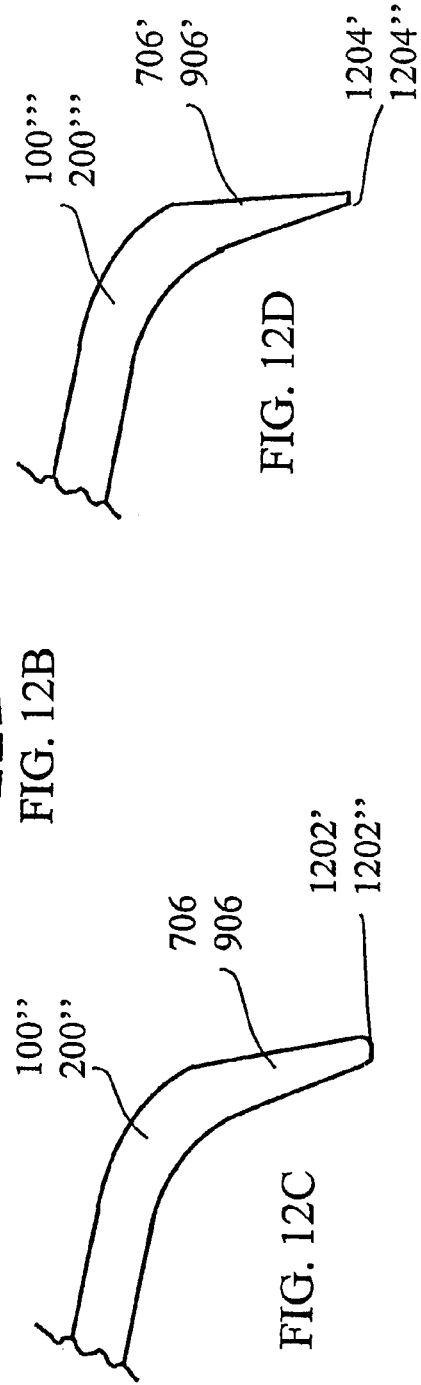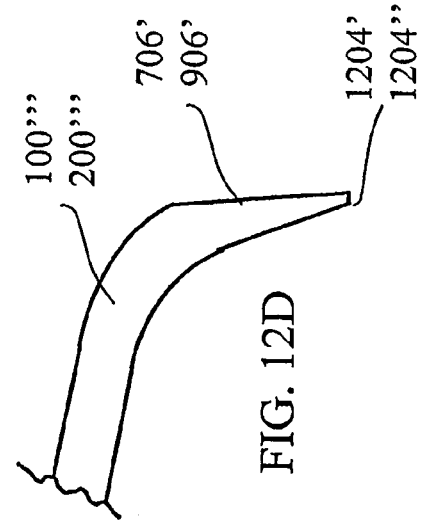
FIG. 12A
FIG. 12B
FIG. 12C
FIG. 12D

CANTILEVER PROBE CARD

FIELD OF THE INVENTION

The present invention relates to probe cards used in testing integrated circuit (IC) devices, and more particularly, to cantilever probe cards.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

Referring to FIGS. 1A and 1B, conventional cantilever probe elements are made from circular or round rod stock 100 that is then chemically etched or mechanically ground at a tip end to achieve a circular taper to reduce the size so that more probe elements may be adjacently aligned for finer pitch integrated circuit (IC) device testing. The probe elements are then bent to form a knee at a designed bend angle and bend radius.

The etched length, i.e., the portion of the probe element that is chemically etched, is the tip length (below the knee) and a designed portion of the beam length above the knee. Most conventional chemically etched probe elements have an etched length that does not include the entire beam length.

Mechanically grinding or chemically etching probe elements is time consuming and expensive. Furthermore, diameter 102 of the ground or chemically etched round conventional cantilever probe elements is not practical for a probe card pitch finer than about 40 μm in fine pitch applications. Otherwise, the crowded adjacent probe elements may electrically short, causing the probe card to be ineffective and/or unreliable.

Such conventional cantilever probe elements are generally made from tungsten (W), tungsten-rhenium (WRe), beryllium-copper (BeCu) or Paliney® 7, a precious-metal alloy comprised of gold, palladium, platinum, silver, copper and zinc (Paliney® is a registered trademark of the J. M. Ney Company, Ney Industrial Park, 2 Douglass Street, Bloomfield, Conn. 06002).

Softer materials may be desirable to use for these probe elements; however, grinding such softer materials tends to cause unacceptable curling or fish-hooking of the tips. Also such softer materials typically would utilize probe element wires having even larger diameters to achieve acceptable rigidity, performance and robustness which would even further restrict the probe card pitch that could be achieved.

The "Probe Card Tutorial" by Otto Weeden, Senior Applications Engineer, Keithley Instruments, Inc., © 2003, Keithley Instruments, Inc. describes issues related to parametric testing of epoxy and blade probe cards. It discusses the effect of probe wire diameter vis-à-vis contact force and pad pitch.

Thus, it would be desirable to provide a method and apparatus for providing cantilever probe cards having finer pitch and/or comprised of cantilever probe elements comprised of more favorable materials overcoming certain of the deficiencies related to conventional techniques.

SUMMARY

According to an embodiment of the invention, a probe card assembly comprising a substrate and a plurality of at least partially flattened probe element wires supported by the substrate is provided.

According to another embodiment of the invention, a probe element wire, comprising a beam portion and a tip portion wherein at least a part of the tip portion is flattened is provided.

According to another embodiment of the invention, a method of processing a probe element wire, comprising the steps of providing a probe element wire configured for use with a probe card assembly and flattening at least a portion of the probe element wire is provided.

BRIEF DESCRIPTION OF THE DRAWINGS

Embodiments of the invention are best understood from the following detailed description when read in connection with the accompanying drawing. It is emphasized that, according to common practice, the various features of the drawing are not to scale. On the contrary, the dimensions of the various features are arbitrarily expanded or reduced for clarity. In the description, relative terms such as "horizontal," "vertical," "up," "down," "top," and "bottom" as well as derivatives thereof (or example, "horizontally," "downwardly," "upwardly," etc.) should be construed to refer to the orientation as then described or as shown in the drawing figure under discussion unless otherwise specifically described. These relative terms are for convenience of description and normally are not intended to require a particular orientation. Terms "inwardly," "outwardly," "longitudinal" versus "lateral" and the like are to be interpreted relative to one another or relative to an axis of elongation, or an axis or center of rotation, as appropriate. Terms such as "connected" and "interconnected" refer to a relationship wherein structures are secured or attached to one another either directly or indirectly through intervening structures, as well as both movable or rigid attachments or relationships, unless expressly described otherwise.

Embodiments of the invention are illustrated by way of example, and not by way of limitation, in the figures of the accompanying drawings and in which like reference numerals refer to similar elements and in which:

FIG. 1A is a side, perspective view illustrating round wire stock;

FIG. 1B is a cross-sectional view of FIG. 1A along line B-B;

FIG. 2A is a side perspective view of a plated, square cross-section wire.

FIG. 2B is a cross-sectional view of FIG. 2A along line B-B;

FIG. 8A is a side perspective view of the tip cut, flattened round wire from FIG. 6 according to an embodiment of the invention;

FIG. 8B is a cross-sectional view of FIG. 8A along line B-B according to an embodiment of the invention;

FIG. 8C is a cross-sectional view of FIG. 8A along line C-C according to an embodiment of the invention;

FIG. 8D is a cross-sectional view of FIG. 8A along line D-D according to an embodiment of the invention;

FIG. 12A is a side perspective view of a probe card according to an embodiment of the invention;

FIG. 12B is an enlarged view of dashed circle B of FIG. 12A according to an embodiment of the invention;

FIG. 12C is an enlarged reoriented view of dashed circle C of FIG. 12B according to an embodiment of the invention;

FIG. 12D is an enlarged reoriented view of dashed circle C of FIG. 12B according to an embodiment of the invention;

DETAILED DESCRIPTION

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

Figure 11:
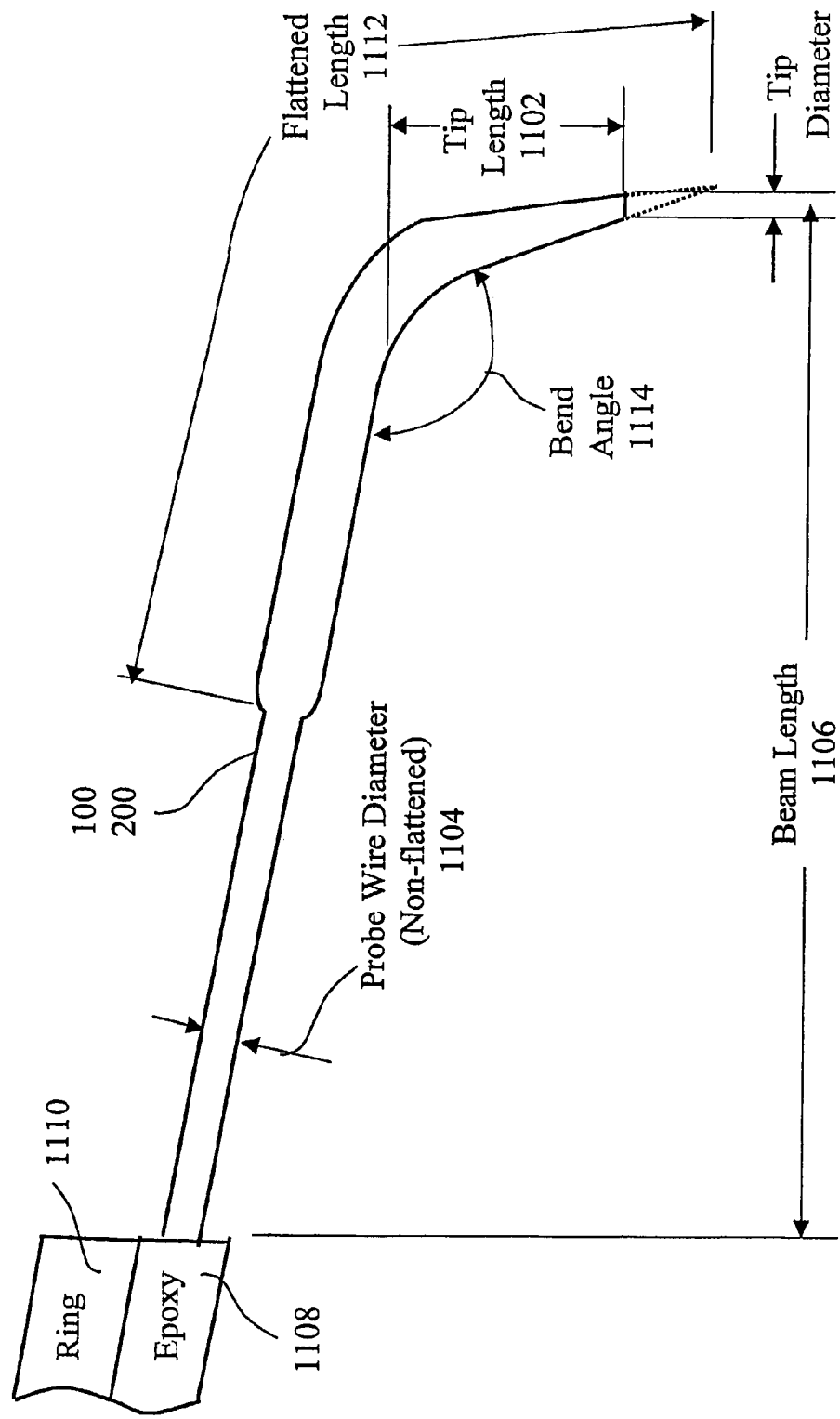
FIG. 11 is a side perspective view of an exemplary mounted, flattened probe element wire defining terms used herein according to an embodiment of the invention.

While the following terms make reference to the drawings, terms used in the specification are not necessarily limited to the specific configuration shown in the drawings. Rather, the configuration shown in the drawings is exemplary in nature and the defined terms could be applied to a number of different probe element configurations. For ease of understanding the following terms or probe elements are defined below. The term "tip length," (see for example reference numeral 1102 in FIG. 11) is the distance, measured vertically from the tip to the inside of the knee bend, expressed in mils. The term "probe wire diameter" (see for example reference numeral 1104 in FIG. 11) is the diameter of the raw round wire from which an exemplary finished probe element is made, expressed in mils. The term "probe tip shape" is the shape of the probe element tip after final processing. The term "beam length" (see for example reference numeral 1106 in FIG. 11) is the distance, measured horizontally; from the center of the probe element tip to the point the flattened probe element enters the epoxy (see for example reference numeral 1108 in FIG. 11) below the ring (see for example reference numeral 1110 in FIG. 11). The term "etch length" is the distance from the theoretical sharp point of a probe element to the point where the wire is at its nominal diameter (for conventional, chemically etched probe elements). The term "flattened" refers to a probe element wire having an increased height and decreased width, for example, due to being subjected to a compressive force or process such as stamping, pressing or rolling. The term "flattened length" (see for example reference numeral 1112 in FIG. 11) is the distance from the theoretical sharp point of a probe element to the point where the flattened beam length portion of the flattened probe element wire ceases and the nominal diameter/cross-section begins. The term "bend angle" (see for example reference numeral 1114 in FIG. 11) is the value of the inside angle of the probe element after bending, expressed in degrees. The term "substrate" refers to any semiconductor structure or integrated circuit (IC) structure to which probes may be mounted, for example at conductive regions thereof, for example the conductive regions may be electrically conductive lines, traces, pads, terminals and/or elements of the, substrate, connected or interconnected. The terms "probe," "probe element" or "probe element wire" refer to any conductive structure, or a portion of such a structure, configured for probing a conductive region of a semiconductor device (for example, a semiconductor device prior to singulation from a wafer, a packaged semiconductor device already singulated from a wafer, etc.). Thus the terms "probe" and "probe element" include such structures having any of a number of shapes and/or configurations (for example straight beam members, bent beam members, curved members, etc.). The term "work hardened" is the result and/or effects upon a probe element by compressibly flattening at least a portion of that probe element, improving its physical and/or mechanical properties.

Referring again to the drawings where like numerals refer to like elements, there is illustrated in FIG. 1A conventional straight round cross-sectional probe element, or (as illustrated) wire, 100 having probe element wire diameter 102 of, for example, from about 0.5 to 20 mils.

According to an embodiment of the invention, a probe element wire may be from about 1 to 10 mils. For example, in certain embodiments of the invention, probe element wire diameter may be as small as 0.5 mils.

In other embodiments of the invention, the diameter of starting round wire may be equal to the desired pitch of the final probe card assembly. For example, for a 25 μm pitch probe card, a 25 μm diameter round wire may be used.

Figure 3A:
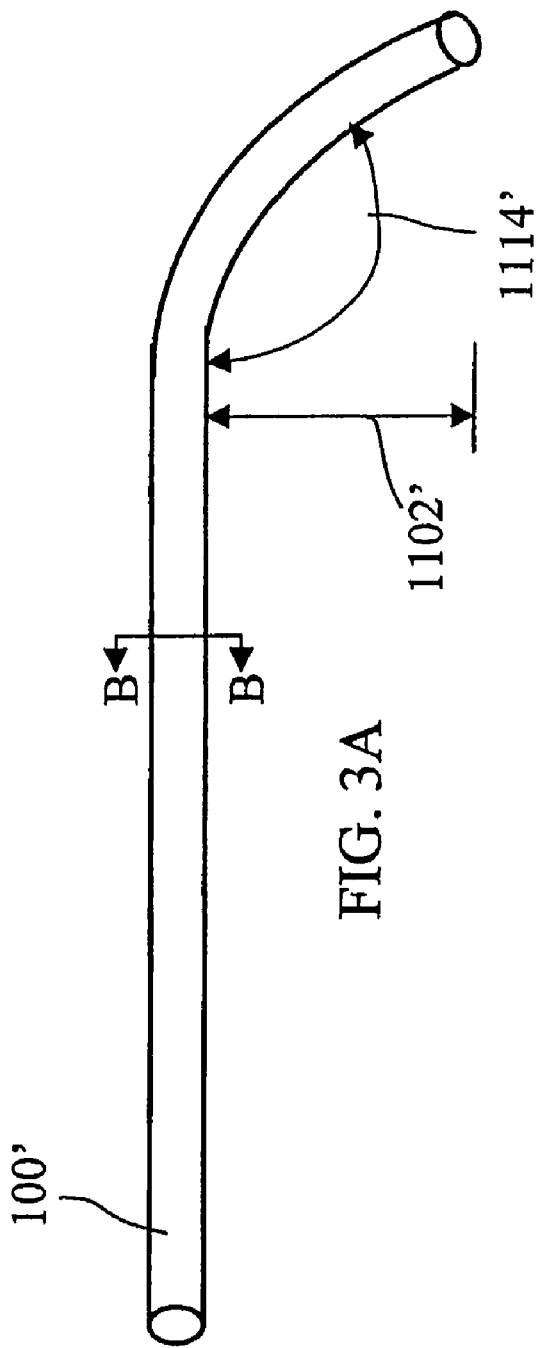
FIG. 3A is a side perspective view of a bent round wire.
Figure 3B:
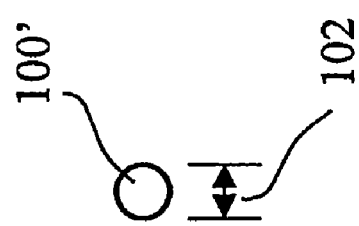
FIG. 3B is a cross-sectional view of FIG. 3A along line B-B.
Figure 4:
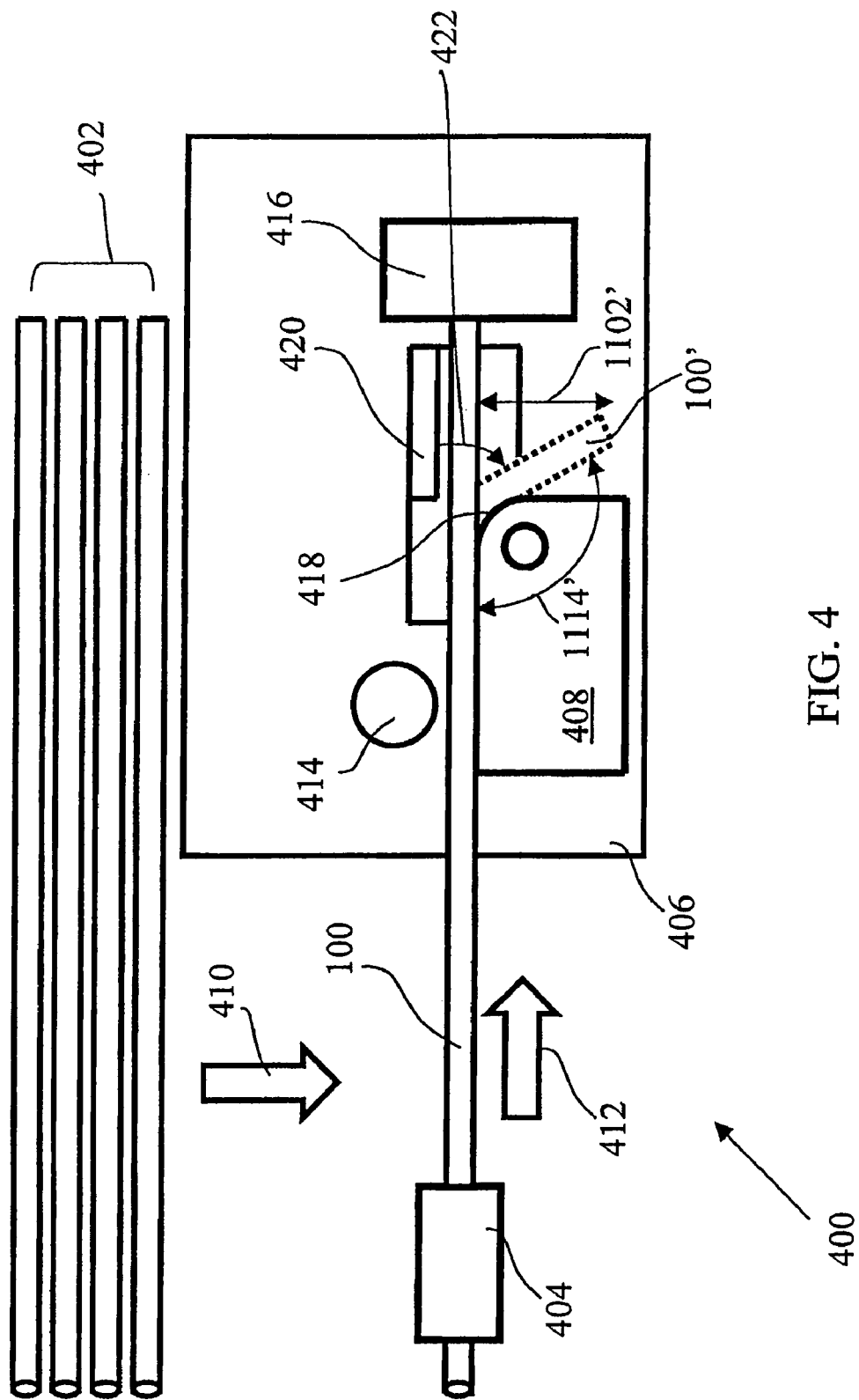
FIG. 4 is a schematic illustration of the bending of the straight, round wire stock of FIG. 1A.

According to certain embodiments, exemplary bent probe wires (and exemplary processes of forming such probe wires) are shown in FIGS. 3A, 3B and FIG. 4, which illustrate exemplary round probe elements while FIGS. 2A and 2B illustrate exemplary square probe elements.

Referring now to FIG. 4, straight, round wire 100 may be bent to the desired bend angle 1114' such as by apparatus 400. It is contemplated that round wire 100 may be bent by other apparatus, means or processes. The apparatus/process shown in FIG. 4 and described herein is not meant to be limiting. Bent, round wire 100' has bend angle 1114' of, for example, from about 80 to 110° and according to an exemplary embodiment of the present invention from about 95 to 105°.

A plurality of the straight, round probe element wires 100 are provided as wire load 402. Individual wires 100 are then taken from the wire load 402 and affixed to wire holder 404 which guides wire 100 downward as shown at arrow 410 and then horizontally in a forward motion as shown at arrow 412 into wire bender 406. Wire 100 is guided on top of radius block 408 and maintained in relative position by guide pin 414. Wire holder 404 positions round wire 100 so as to come into contact with wire stop block 416, stopping the forward horizontal motion of round wire 100.

End 418 of radius block 408 proximate the end of round wire 100 contacting wire stop block 416, is, for example, rounded to facilitate bending of round wire 100.

Bending bar 420 positioned above the end of round wire 100 contacting wire stop block 416 then rotates along line 422, bending that end of round wire 100 to form bent round wire 100' (partially shown in dashed lines) (also see, for example, FIG. 3A) having tip length 1102' of, for example, from about 3 to 60 mils, and according to an embodiment of the invention from about 5 to 30 mils.

This process is repeatable to form substantially uniform, bent round wires 100' shown in FIG. 3A. FIG. 3B is a cross-sectional view of bent round probe element wire 100' along line B-B of FIG. 3A. Diameter 102 of bent round wire 100' is the same as the diameter of straight, round probe element wires shown in FIG. 1A.

Referring now to FIGS. 2A and 2B, square cross-sectional probe element wire 200' is illustrated which may be formed by plating, for example, or other means, methods or processes, and having equal z-direction height 202 and y-direction width 204 that is formed with desired bend angle 1114". As is known to one skilled in the art, plating typically involves the formation of a structure beginning with a two-dimensional shape and building upon that shape in the third-dimension to a desired thickness.

Z-direction width 202 and y-direction width 204 may be, for example, from about 0.25 to 10 mils, and according to a particular embodiment of the invention, from about 0.5 to 3 mils. According to certain embodiments of the invention, z-direction height 202 and y-direction width 204 may be as small as 0.25 mil. Bent, plated wire 200' bend angle 1114" is, for example, from about 80 to 110°, and according to a particular embodiment of the invention, from about 95 to 105°.

Bent, plated wire 200' has tip length 1102" of, for example, from about 3 to 60 mils, and according to a particular embodiment of the invention, from about 5 to 30 mils.

Embodiments of the invention compressibly flatten probe element wires 100', 200' to create flattened probe element wires 100", 100'", 200", and 200'". Flattened probe element wires 100", 100'", 200", and 200'" may become work hardened, thereby improving their physical and mechanical properties at least as they apply to functioning as probe element wires. Exemplary processes and structures for flattening probe element wires are illustrated in FIGS. 5A and 5B.

While the entire of the length of probe element wires 100', 200' may be flattened to achieve maximum pitch density, it may be desirable that only a portion of probe element wire 100', 200' length is flattened to define flattened length 1112, 1112', 1112".

Figure 5A:
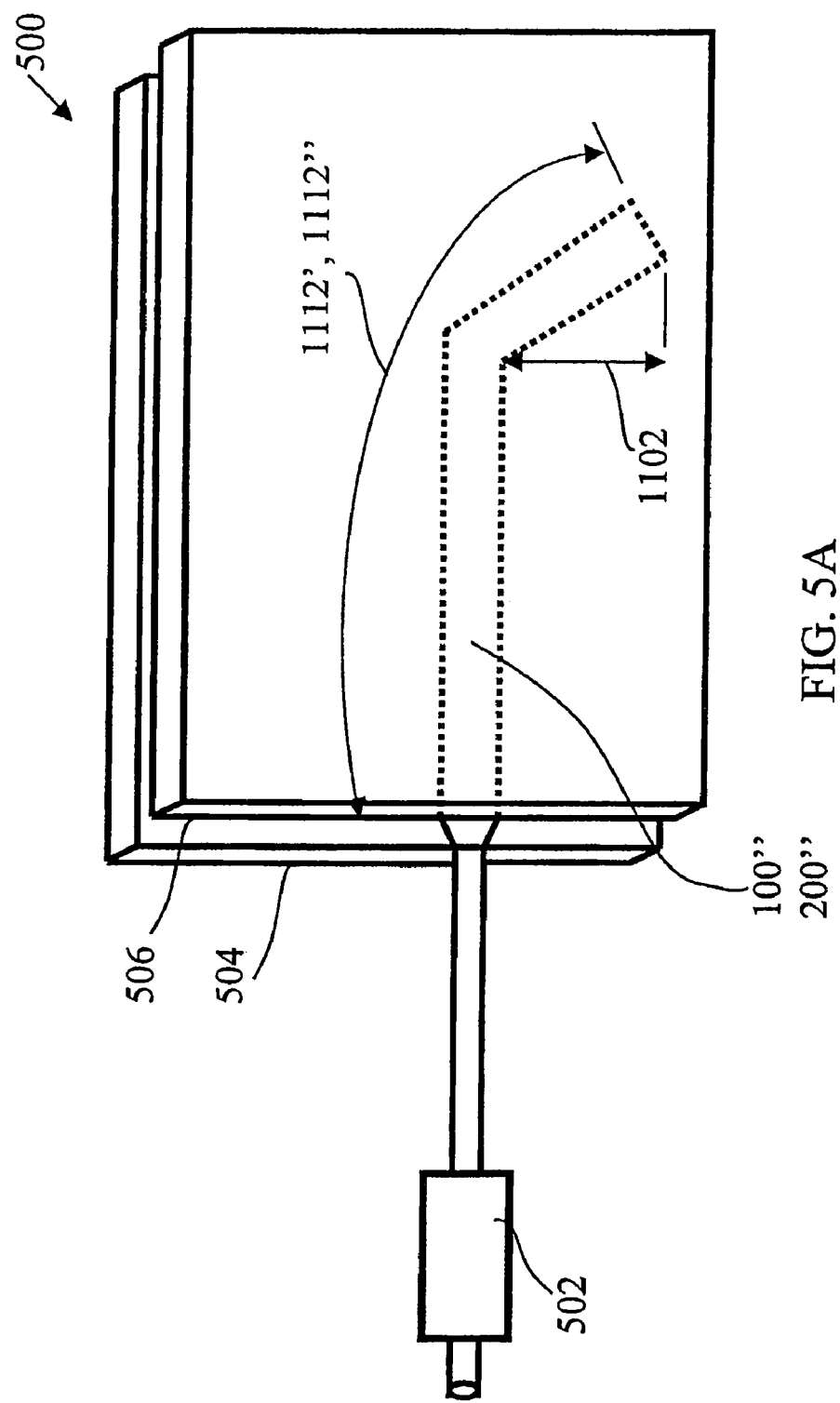
FIG. 5A is a schematic illustration of the stamping or pressing of a bent wire according to an embodiment of the invention.
Figure 5B:
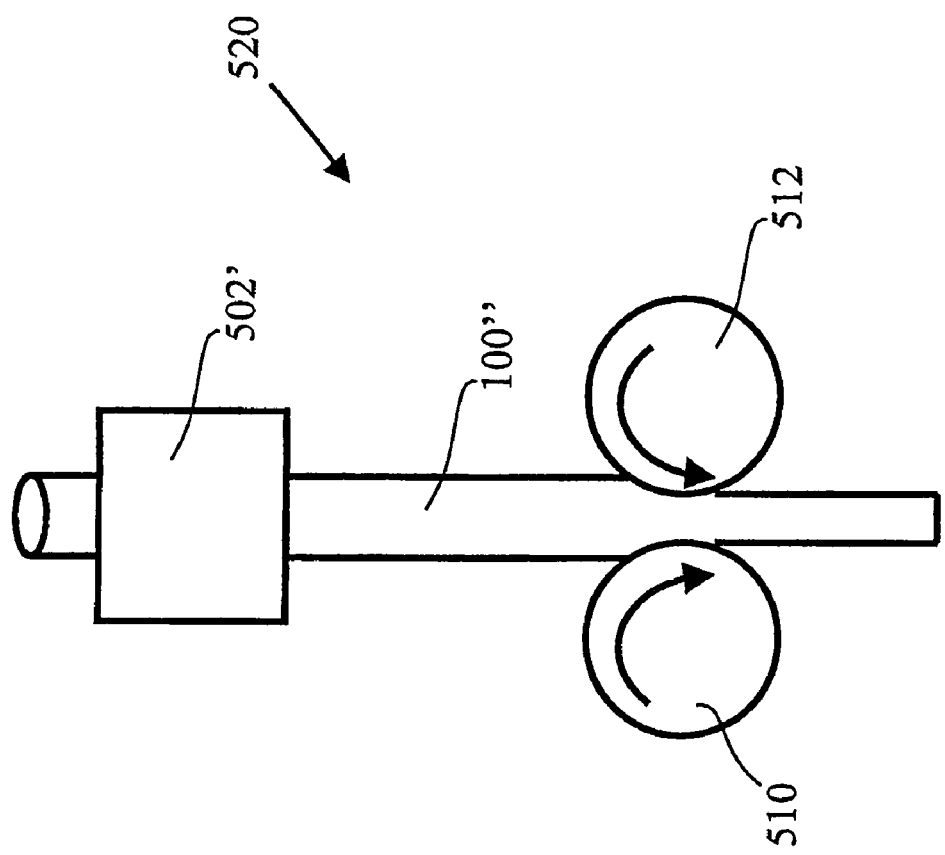
FIG. 5B is a schematic illustration of the rolling of a bent, round wire according to an embodiment of the invention.

Referring now to FIG. 5A, bent probe element wires 100', 200' may then be flattened by stamping or pressing by a stamping/pressing device 500 to form respective flattened lengths 1112', 1112" including respective flattened tip length portions 1102', 1102" of respective beam length portions 1106', 1106" (see, for example, FIGS. 7A, 8A, 9A and 10A).

It is contemplated that probe element wire 100', 200' may be flattened by other apparatus, means or processes so long as the flattening includes compression in at least one dimension. Such flattening may desirably work harden wire 100', 200' as discussed above. The apparatus/process shown in FIG. 5A is not meant to be limiting.

Exemplary flattened probe element wire 100", 200" is reduced: in diameter in the y-direction; in the y-direction width, respectively of, for example, from about 10 to 60%, and according to a particular embodiment of the invention, from about 25 to 50%.

Specifically, as illustrated in the embodiment depicted in FIG. 5A, bent probe element wire 100', 200' of FIGS. 3A and 2A, respectively, is held in place by wire holder 502, or the like, which guides and/or places bent wire 100', 200' between opposing stamp blocks 504, 506, for example, such that the tip of bent wire 100', 200' to the portion of beam length 1106', 1106" desired to be flattened, i.e., flattened length 1112', 1112", is between stamp blocks 504, 506. Stamp blocks 504, 506 are then forced together with sufficient force to compressibly flattened bent wire 100', 200' to desired reduced width 702, 902 in the y-direction. This produces compressively flattened ("flattened") probe element wire 100", 200" (see, for example, FIGS. 7A to 7C and 9A to 9C).

FIG. 5B depicts another method of compressibly flattening bent round probe element wire 100' using roller device 520 having, inter alia, opposing rollers 510, 512 to form flattened probe element wire 100" as described above and hereinafter. Specifically, bent probe element wire 100' (for example of FIG. 3A) is held in place by wire holder 502' or the like which guides bent wire 100' between opposing, rotating rollers 510, 512 a specified distance to achieve desired flattened length 1112' as shown, for example, in FIG. 7A. Flattened probe element wire 100" is then withdrawn from rollers 510, 512 or the rollers may be separated.

Opposing rollers 510, 512 are spaced apart a sufficient distance to achieve desired reduced width 702 in the y-direction for flattened round probe element wire 100".

It is contemplated that probe element wire 100' may be roll flattened by other apparatus, means or processes so long as the roll flattening includes compression in at least one dimension. Such flattening may desirably work harden probe element wire 100' as discussed above. The apparatus/process shown in FIG. 5B is not meant to be limiting.

Flattened probe element wire 100" is reduced in diameter 102 in the y-direction to y-direction width 702 of, for example, from about 10 to 60%, and according to a particular embodiment of the invention, from about 25 to 50%.

It is noted and, as described below, that tips 706, 906 of flattened probe element wires 100", 200" may be further processed to achieve design specifications for the probe card to which flattened probe element wire 100", 200" will be affixed.

It is contemplated that an etched (chemically etched)/ground (mechanically ground) round wire stock having an etch/ground tip portion may be used in which case only a portion, for example only that portion of the etched/ground round wire stock having a diameter of greater than about 1.5 mils is flattened.

The at least partial flattening of probe element wires 100', 200' in accordance with the exemplary embodiments of the present invention permits closer packing of adjacent flattened probe element wires 100", 100'"; 200", 200'", and thus providing the ability to place more probe elements in a given of probe card assembly 1260, 1260'.

Figure 6:
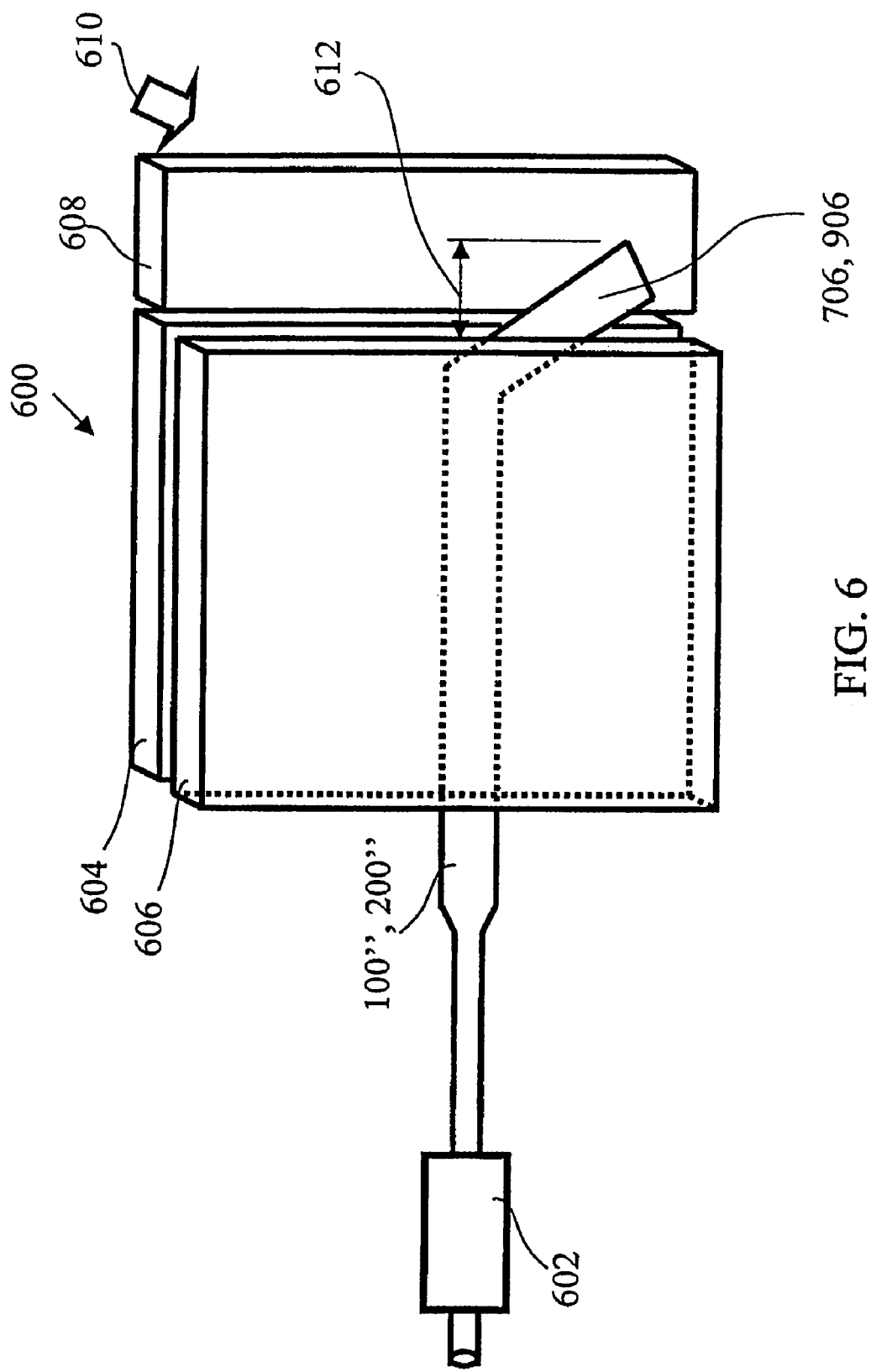
FIG. 6 is a schematic illustration of tip cutting the flattened wire from FIG. 5A or 5B according to an embodiment of the invention.

Referring now to an exemplary structure illustrated in FIG. 6, flattened probe element wires 100", 200" may then have their respective tips 706, 906 cut to sharp, angled point 808, 1008 (also see, for example, FIGS. 8A, 8D; and 10A, 10D, respectively) by tip cutting device 600. Tip cutting device 600 includes, inter alia, opposing tip holding blocks 604, 606 and tip cutting block 608.

Specifically, flattened probe element wire 100", 200" (for example, the wire shown in FIGS. 7A and 9A, respectively) is held in place by wire holder 602, or the like, which guides/places flattened wire 100", 200" between opposing tip holding blocks 604, 606 such that the tip of flattened wire 100", 200" extends specified distance 612 past tip holding blocks 604, 606 to achieve the desired sharp point 808, 1008 (see, for example, FIGS. 8A, 8D and 10A, 10D, respectively). Tip holding blocks 604, 606 are then urged together to fixedly hold flattened probe element wire 100", 200" in place.

Tip cutting block 608 is then moved perpendicular to the longitudinal x-axis of flattened probe element wire 100", 200" along direction 610 with sufficient force and speed to cut tip 706, 906 of flattened probe element wire 100", 200" to form flattened, tipped probe element wire 100''', 200''' having sharp tip 808, 1008.

It is contemplated that sharp tips 808, 1008 of flattened, tipped probe element wires 100''', 200''' may be formed by other apparatus, means or processes (for example laser cutting, etching, stamping, etc.). The apparatus/process shown in FIG. 6 and described herein is not meant to be limiting. Further, it is contemplated that the tip cutting structure could be combined with a flattening structure (for example, stamping/pressing device 500 illustrated in FIG. 5A).

It is noted and, as described below, sharp tips 808, 1008 of flattened, tipped probe element wires 100''', 200''' may be further processed to achieve design specifications for the probe card to which flattened, tipped probe element wire 100''', 200''' will be affixed.

Figure 7A:
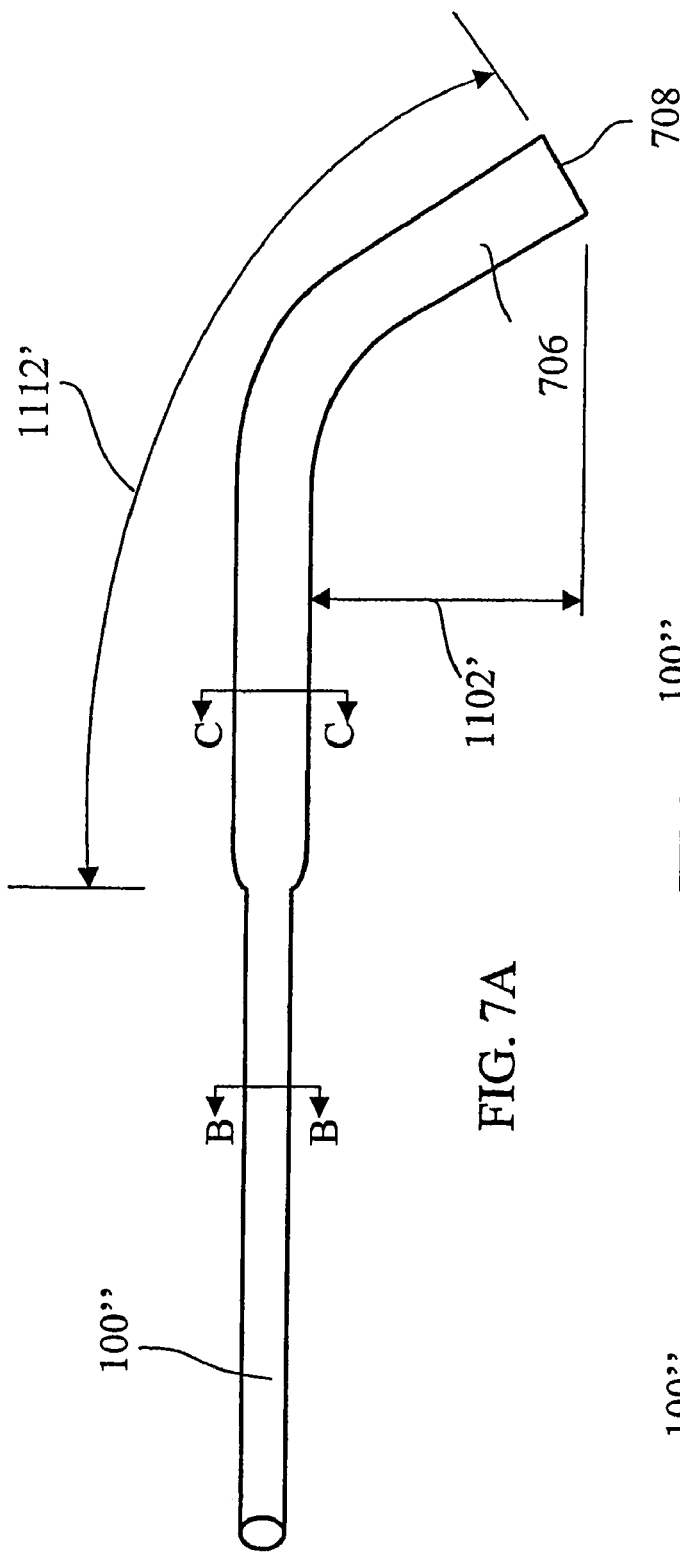
FIG. 7A is a side perspective view of the flattened round wire of FIG. 5A or 5B according to an embodiment of the invention.
Figure 7C:
FIG. 7C is a cross-sectional view of FIG. 7A along line C-C according to an embodiment of the invention.
Figure 7B:
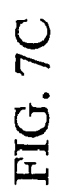
FIG. 7B is a cross-sectional view of FIG. 7A along line B-B according to an embodiment of the invention.

Referring now to FIGS. 7A to 7C, flattened, non-cut round probe element wire 100" has flattened length 1112' and flattened tip length 1102' to meet design specifications.

An exemplary flattened length portion 1112' is, for example, from about 10 to 100% of the beam length 1106' (see, for example, FIG. 11) and is preferably about 30% of beam length 1106' as compared with a conventional (for example etched) probe element wire which would have an etch length of, for example, from about 30 to 70% of the beam length (with beam length 1106', 1106" measured horizontally being from the center of probe element tip 706, 706'; 906, 906' to the point flattened probe element 100", 100''', 200", 200''' enters epoxy 1108 below ring 1110 (see, for example, FIG. 11)). For example, the flattened length portion 1112' may be from about 5.0 to 1500 mils for a 3 to 4 inch flattened probe element wire 100", 100''', 200", 200'''.

Referring now to FIG. 7B, the cross-section of non-flattened beam length 1106' taken along line B-B is/remains circular having diameter 102. For a probe card design pitch of 40 μm, a 40 μm diameter wire may be processed in accordance with the teachings of this invention. Referring now to FIG. 7C, the cross-section of flattened length portion 1112' taken along line C-C has a roughly oval shape with z-direction height 704 greater than y-direction width 702. Z-direction height 704 is, for example, from about 10 to 200% greater than circular diameter 102 and preferably up to about 100% greater than the circular diameter 102. Y-direction width 702 is, for example, from about 10 to 60% less than circular diameter 102 and preferably up to about 50% less than circular diameter 102.

FIG. 7A also illustrates tip 706 terminating in flat tip end 708. The final probe element wire may maintain flat tip end 708 or it may be further processed into, for example, radiused tip end 1202' (see, for example, FIG. 12C) as described below.

Figures 9A, 9B, 9C:
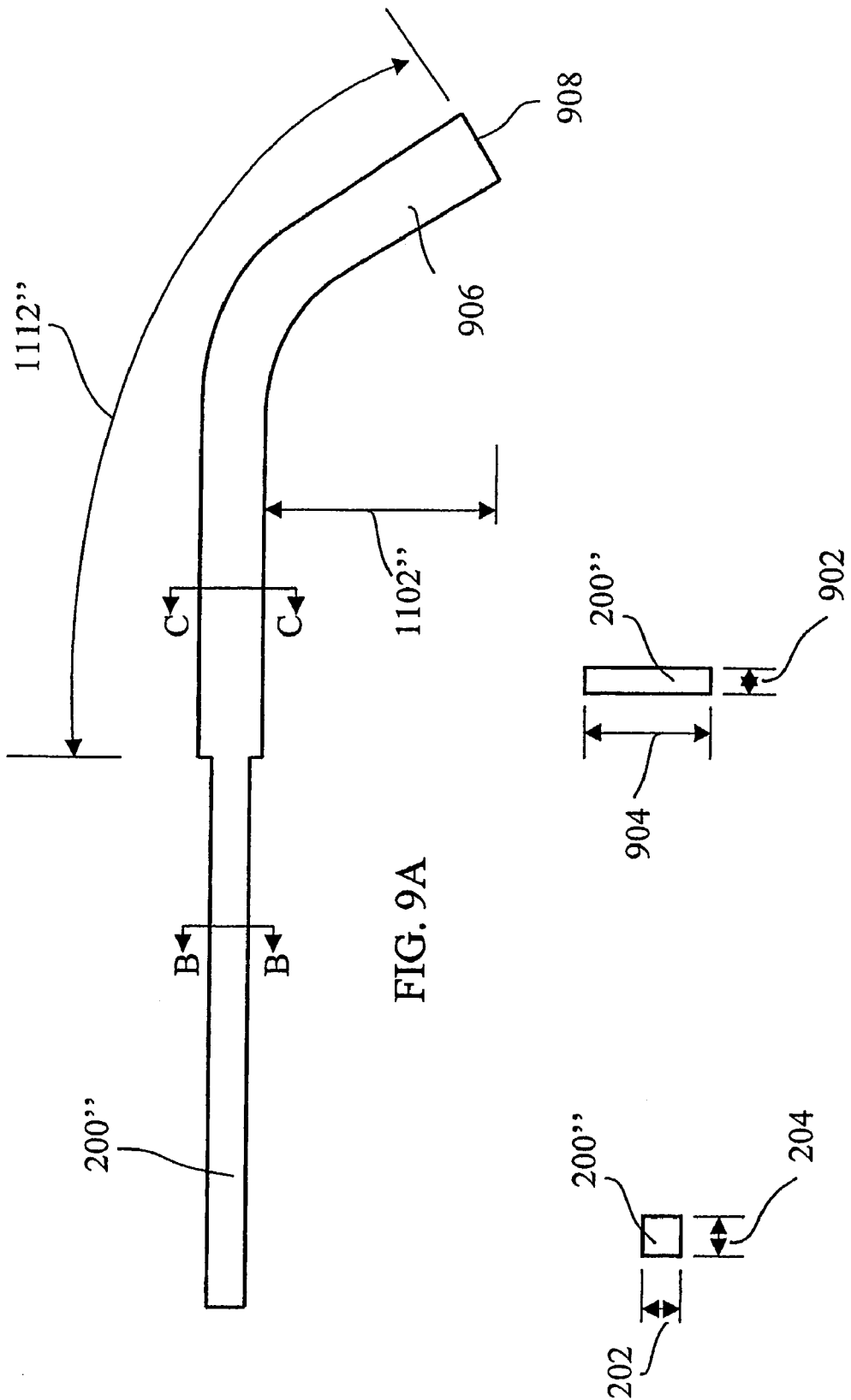
FIG. 9A is a side perspective view of the flattened square wire of FIG. 5A according to an embodiment of the invention.
FIG. 9B is a cross-sectional view of FIG. 9A along line B-B according to an embodiment of the invention.
FIG. 9C is a cross-sectional view of FIG. 9A along line C-C according to an embodiment of the invention.

Referring now to FIGS. 9A to 9C, flattened square probe element wire 200" has flattened length 1112" and flattened tip length 1102" to meet design specifications.

An exemplary flattened length portion 1112" is, for example, from about 10 to 100% of beam length 1106' (see, for example, FIG. 11) and is preferably about 30% of beam length 1106' as compared with a conventional (for example etched) probe element wire which would have an etch length of from about 30 to 70% of the beam length (with beam length 1106', 1106" measured horizontally being from the center of probe element tip 706, 706'; 906, 906' to the point flattened probe element wire 100", 100''', 200", 200''' enters epoxy 1108 below ring 1110 (see, for example, FIG. 11)). For example, flattened length portion 1112" may be from about 300 to 500 mils for a 3 to 4 inch flattened probe element wire 100", 100''', 200", 200'''.

As shown in FIG. 9B, the cross-section of non-flattened beam length 1106" taken along line B-B is/remains square having z-direction height 202 and y-direction width 204.

As shown in FIG. 9C, the cross-section of flattened length portion 1112" taken along line C-C has a roughly rectangular shape with z-direction height 904 greater than y-direction width 902. Z-direction height 904 is, for example, from about 10 to 200% greater than square z-direction height 202, and according to an exemplary embodiment of the present invention up to about 100% greater than square z-direction height 202. Y-direction width 902 is, for example, from about 10 to 60% less than the square y-direction width 202, and according to an exemplary embodiment of the present invention up to about 50% less than the square y-direction width 202.

FIG. 9A also illustrates tip 906 terminating in flat tip end 908. Probe element wire 200" may maintain this flat tip end 908 or it may be further processed into, for example, radiused tip end 1202" (see, for example, FIG. 12C) as described below.

Referring now to FIGS. 8A to 8D, flattened, tip cut round probe element wires 100''' have flattened length 1112' and flattened tip length 1102' to meet design specifications.

As with the flattened, non-cut round probe element wire 100", flattened length portion 1112' is, for example, from about 20 to 50% of beam length 1106' (see, for example, FIG. 11) and is preferably about 30% of beam length 1106' as compared with a conventional (for example etched) probe element wire which would have an etch length of from about 30 to 70% of the beam length (with beam length 1106', 1106" measured horizontally being from the center of probe element tip 706, 706'; 906, 906' to the point flattened probe element wire 100", 100''', 200", 200''' enters epoxy 1108 below ring 1110 (see, for example, FIG. 11)). For example, flattened length portion 1112' may be from about 300 to 500 mils for a 3 to 4 inch flattened probe element wire 100", 100''', 200", 200'''.

As shown in FIG. 8B, the cross-section of non-flattened beam length 1106' taken along line B-B is/remains circular having diameter 102. For a probe card design pitch of 40 μm, a 40 μm diameter wire may be processed in accordance with the teachings of this invention.

As shown in FIG. 8C, the cross-section of flattened length portion 1112' taken along line C-C has a roughly oval shape with z-direction height 704 greater than y-direction width 702. Z-direction height 704 is, for example, from about 10 to 200% greater than circular diameter 102, and according to an exemplary embodiment of the present invention up to about 100% greater than circular diameter 102. Y-direction width 702 is, for example, from about 10 to 60% less than circular diameter 102 and preferably up to about 50% less than circular diameter 102.

FIGS. 8A and 8D (viewed along line D-D of FIG. 8A) illustrate tip 706' terminating in angled tip end 808. The final probe element wire may maintain this angled tip end 808 or it may be further processed into, for example, radiused cut tip end 1204' (see, for example, FIG. 12D) as described below.

Referring now to FIGS. 10A to 10D, flattened, tip cut square probe element wires 200 have flattened lengths 1112" and flattened tip lengths 1102" to meet design specifications.

As with non-cut square probe element wire 200", flattened length portion 1112" is, for example, from about 20 to 50% of beam length 1106" (see, for example, FIG. 11) and is preferably about 30% of beam length 1106" as compared with a conventional (for example, etched) probe element wire which would have an etch length of from about 30 to 70% of the beam length (with beam length 1106', 1106" measured horizontally being from the center of probe element tip 706, 706'; 906, 906' to the point flattened probe element wire 100", 100"', 200", 200"' enters epoxy 1108 below ring 1110 (see, for example, FIG. 11)). For example, the flattened length portion 1112' may be from about 300 to 500 mils for a 3 to 4 inch flattened probe element wire 100", 100"', 200", 200"'.

Figures 10A, 10B, 10C, 10D:
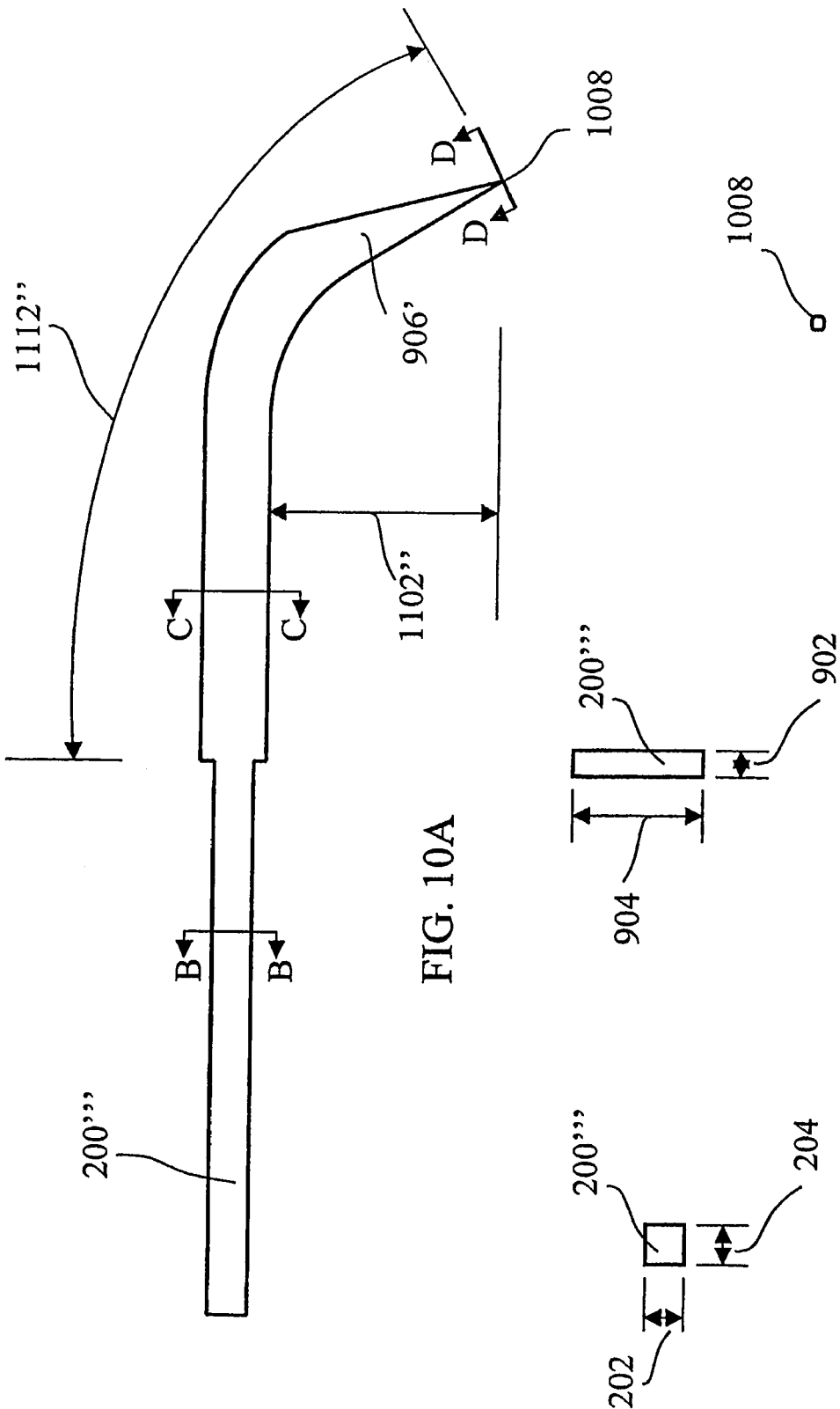
FIG. 10A is a side perspective view of the tip cut, flattened square wire of FIG. 6 according to an embodiment of the invention.
FIG. 10B is a cross-sectional view of FIG. 10A along line B-B according to an embodiment of the invention.
FIG. 10C is a cross-sectional view of FIG. 10A along line C-C according to an embodiment of the invention.
FIG. 10D is a cross-sectional view of FIG. 10A along line D-D according to an embodiment of the invention.

As shown in FIG. 10B, the cross-section of non-flattened beam length 1106' taken along line B-B is/remains square having z-direction height 202 and y-direction width 204. For a probe card design pitch of 40 µm, a 40 µm square wire may be processed in accordance with the teachings of this invention.

As shown in FIG. 10C, the cross-section of flattened length portion 1112" taken along line C-C has a roughly rectangular shape with z-direction height 904 greater than y-direction width 902. Z-direction height 904 is, for example, from about 10 to 200% greater than square z-direction height 202, and according to a particular embodiment of the invention, up to about 100% greater than circular diameter 202. Y-direction width 902 is, for example, from about 10 to 60% less than square y-direction width 202, and according to a particular embodiment of the invention, up to about 50% less than square y-direction width 202.

FIGS. 10A and 10D (viewed along line D-D of FIG. 10A) illustrate tip 906' terminating in angled tip end 1008. Probe element wire 200"' may maintain this angled tip end 1008 or it may be further processed into, for example, a radiused cut tip end 1204" (see, for example, FIG. 12D) as described below.

Figure 12E:
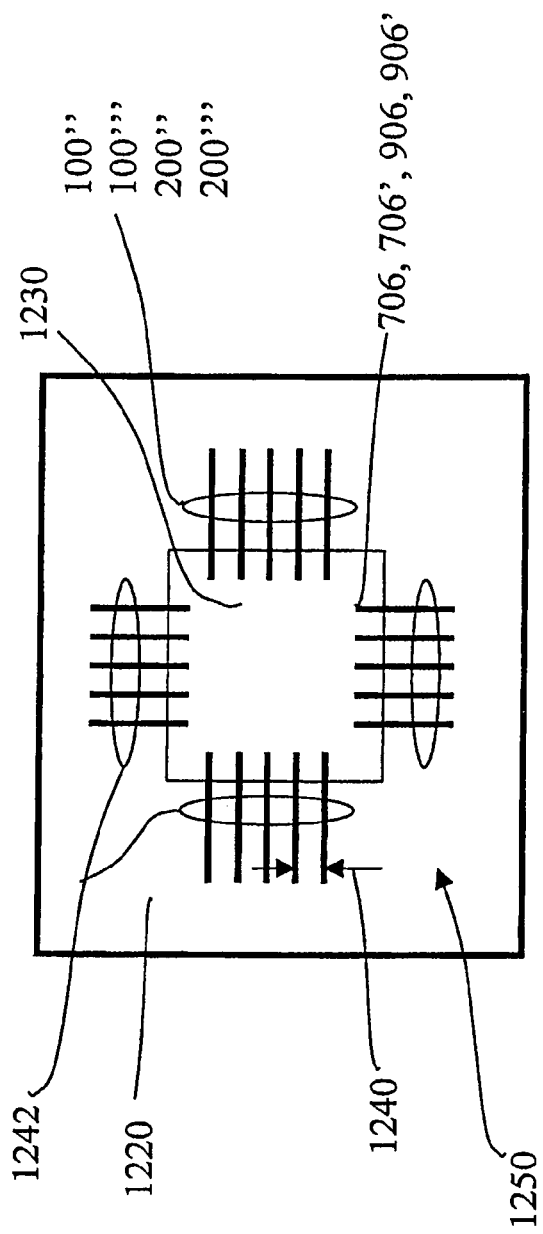
FIG. 12E is an enlarged top down plan view of a portion of FIG. 12B showing adjacent flattened probe element wires according to an embodiment of the invention.

Referring now to FIGS. 12A and 12B (an enlarged view of FIG. 12A at dashed circle "B"), flattened probe element wires 100", 100"'; 200", 200"' processed in accordance with the teachings of the present invention may be coupled to substrate 1220, such as a printed circuit board (PCB) at respective conductive regions/pads 1222, for example, to form, or at least partially form, probe card assembly 1260. This is also shown in FIG. 12E which is an enlarged, bottom up plan view of FIG. 12A.

For example, distal ends 1224 of flattened probe element wires 100", 100"', 200", 200"' may be first nickel-plated or the like as desired (for example if the probe element wires are not comprised of a solder wetable material, to permit effective soldering of distal ends 1224 to the respective conductive regions/pads 1222). Probe element wires 100", 100"', 200", 200"' are then soldered (or otherwise conductively bonded) to respective pads 1222 to form spider 1250 (see FIG. 12E, for example) or collective grouping of probe element wires about substrate 1220.

Ring 1110 and epoxy 1108 (see, for example, FIG. 11) may be added to define beam lengths 1106', 1106" and to affix spider 1250 of flattened probe element wires 100", 100"'; 200", 200"' to substrate 1220. This also provides some lateral support for flattened probe element wires 100", 100"'; 200", 200"'.

Substrate 1220 may be a printed circuit board (PCB), an MLC (multi-layer ceramic) substrate, an MLO (multi-layer organic) substrate or any of a number of substrates. Further, the substrate 1220 may or may not be a space transformer.

Then, after all desired testing, such as a Planarity and Alignment (P&A) Test and/or a Probe Card Analysis (PCA) Test have been satisfactorily performed, elastomeric material 1242 may be added to the epoxy binding spider 1250 to increase support, and especially lateral support, of adjacent flattened probe element wires 100", 100"', 200".

While the flattening of probe element wires 100', 200' may increase the strength of flattened probe element wires 100", 100"'; 200", 200"' in the increased z-direction height 704, 904, respectively, the respective reduced y-direction width 702, 902 strength may be lessened.

Thus, elastomeric material 1242 may be added to the ring mounted spider 1250 to provide for increased lateral support for the respective reduced y-direction width 702, 902 of flattened probe element wires 100", 100"'; 200", 200"'. Elastomeric material 1242 so added may be easily removable in the event of any future repair of probe element wires 100", 100"'; 200", 200"' of spider 1250.

The majority of the z-direction deflection of flattened probe element wires 100", 100"'; 200", 200"' tends to occur in the respective round portion; square portion of the probe element wires between flattened length portion 1112, 1112', 1112" and epoxy 1108, 1108', 1008"/elastomeric material/ring 1110, 1110', 1110".

The tips 706, 706'; 906, 906' of mounted probe element wires 100", 100"'; 200", 200"' may be further processed as a group to form respective radiused tip ends 1202', 1202"; 1204', 1204" as described herein and as shown in, for example, FIGS. 12C and 12D. FIG. 12C illustrates radiused tip end 1202', 1202" of respective round, non-cut tip 706 (see, for example, FIG. 7A) and square, non-cut tip 906 (see, for example, FIG. 9A) and FIG. 12D illustrates radiused tip end 1204', 1204" of respective round, cut tip 706' (see, for example, FIG. 8A) and square, cut tip 906' (see, for example, FIG. 10A). FIG. 12C is an enlargement of FIG. 12B at circle "C" showing first exemplary tip ends 1202', 1202" and FIG. 12D is an enlargement of FIG. 12B at circle "C" showing second exemplary tip ends 1204', 1204".

For example, referring to FIG. 12E, in order to radius the tips to a desired shape, the ends of tips 706, 706'; 906, 906' may be at least partially extended multiple times into a structure 1230 (see, for example, FIG. 12F) which wears the tip ends of tips 706, 706'; 906, 906' to form radiused tip ends 1202', 1202"; 1204', 1204".

Figure 12F:
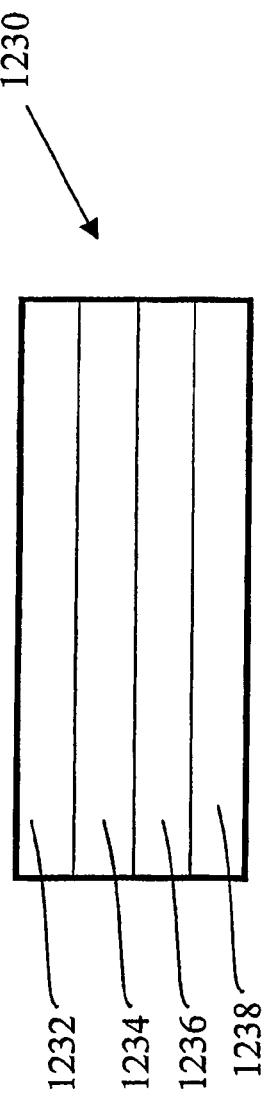
FIG. 12F is an enlarged cross-sectional view of a portion of FIG. 12E according to an embodiment of the invention.

The structure 1230 may comprise sand, an abrasive powder or, as shown in FIG. 12F, or example, alternating layers of adhesive material layers 1232, 1236 and abrasive material layers 1234, 1238. Exemplary structures for shaping tips 706, 706'; 906, 906' of the probe elements are disclosed in U.S. Pat. No. 6,908,364, incorporated by reference for all purposes in its entirety as if fully set forth herein and pending U.S. patent application Ser. No. 11/139,460, incorporated by reference for all purposes in its entirety as if fully set forth herein, which claims priority of U.S. patent application Ser. No. 09/921,327, filed Aug. 2, 2001 which matured into U.S. Pat. No. 6,908,364 above. For example when such structures to provide a desired tip shape, 5000 to 20,000 touchdowns may be used to achieve a desired 0.4 to 1.0 mil tip radius.

Tips 706, 706'; 906, 906' may be manufactured of a greater (initial) tip length than required so as to permit all tips 706, 706'; 906, 906' to be further processed as a group to achieve co-planarity of final tip ends 708, 808, 1202', 1202"; 908, 1008, 1204", 1204" (for example) once coupled to substrate 1220 in spider 1250. This may be achieved during the radius processing described above, for example.

Thus, final tip ends 708, 808, 1202', 1202"; 908, 1008, 1204', 1204" (for example) of the probe elements according to exemplary embodiments of the present invention may have a number of different shapes, for example: flat 708, 908 as shown in, for example, FIGS. 7A and 9A, respectively; angled 808, 1008 as shown in, for example, FIGS. 8A, 8D; 10A, 10D, respectively; or radiused 1202', 1202"; 1204', 1204" as shown in, for example, FIGS. 12C and 12D, respectively.

As shown in FIG. 12E, the distance between adjacent probe element wires is pitch 1240. When utilizing flattened probe element wires 100, 100'''; 200", 200''' of the present invention, pitch 1240 may be decreased as flattened lengths 1112', 1112" permit closer spacing/pitch between adjacent probe element wires as compared to non-flattened conventional probe element wires. Not only does this decrease the maximum overall pitch of such probe card assemblies 1260, 1260', comparable pitches may be achieved as compared to non-flattened conventional probe element wires with less rows or tiers of probe element wires 100", 100'''; 200", 200''' as there is less of a tendency to tier such probe element wires for a desired pitch.

For example, for a 35 μm pitch using the probe element wires 100", 100'''; 200", 200''' of the present invention in a single row pad, there may be one probe layer having an 0.85 mil probe width and a 0.53 mil probe spacing.

Figure 13:
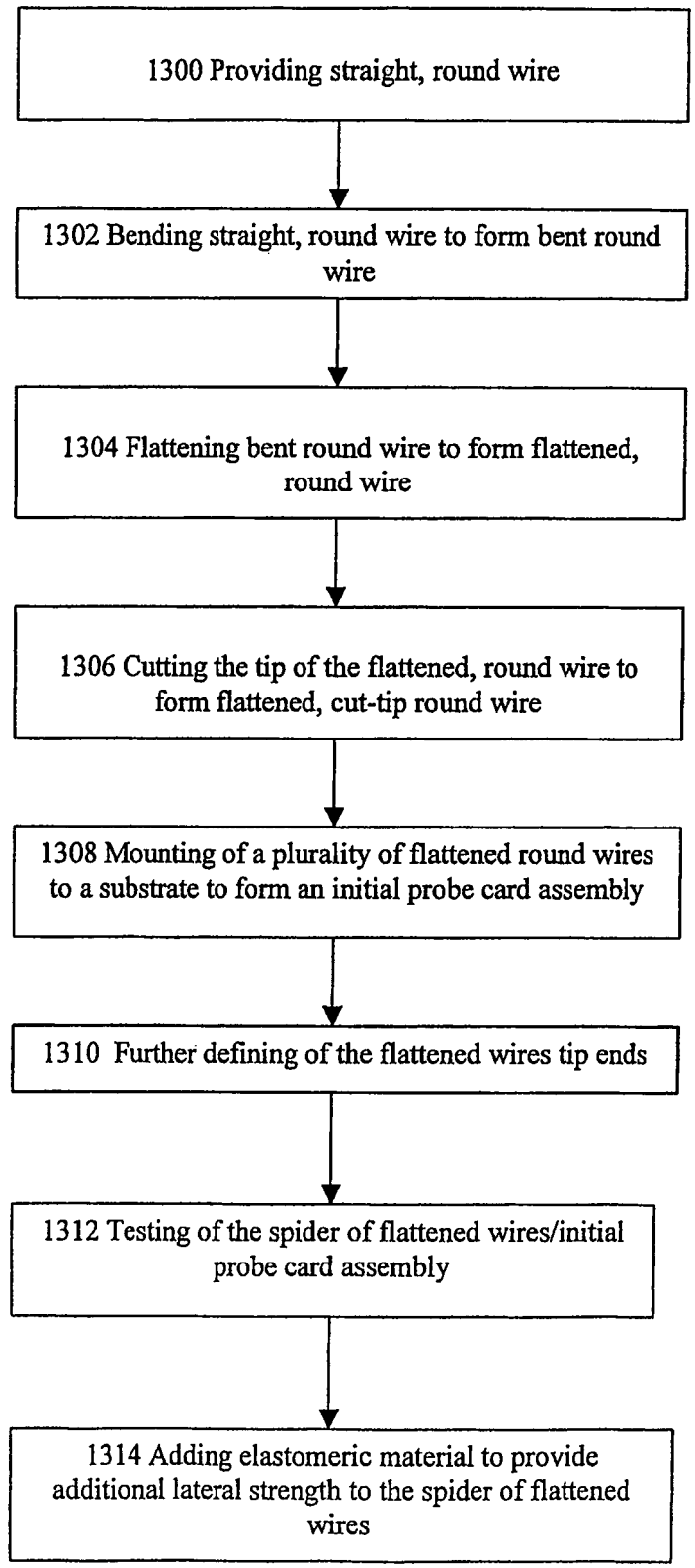
FIG. 13 is a flowchart illustrating the steps of constructing a first probe according to an embodiment of the invention.
Figure 14:
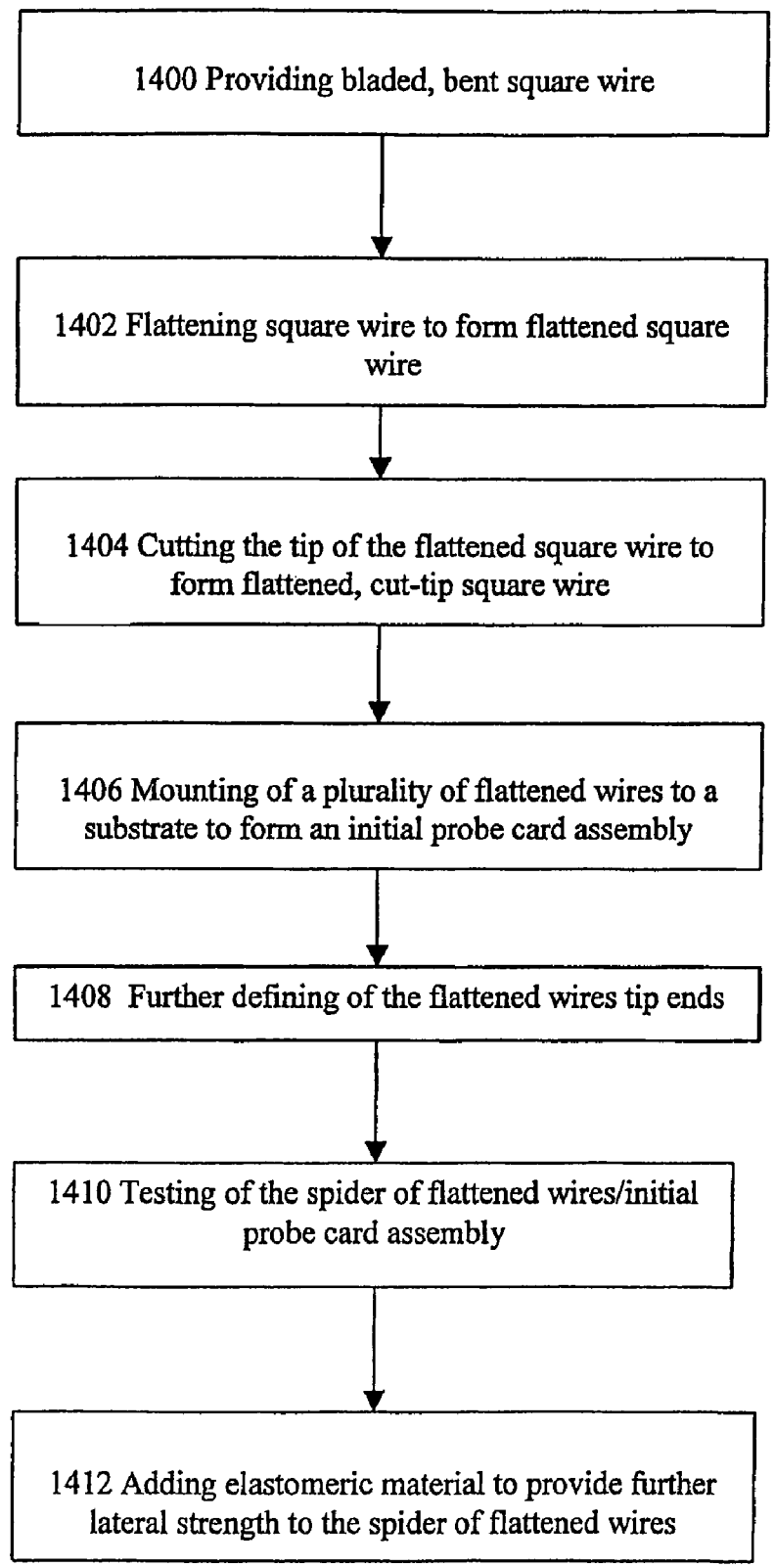
FIG. 14 is a flowchart illustrating the steps of constructing a second probe according to an embodiment of the invention.

Now referring to FIGS. 13 and 14, there is shown respective flow charts for the processing of round wire 100 (see, for example, FIG. 1A) and square wire 200' (see, for example, FIG. 2A) according to an embodiment of the invention.

As shown in step 1300 of FIG. 13, straight, round wire stock 100 is provided. In step 1302, the straight, round wire stock 100 is bent to form bent, round wire 100' having the desired bend angle 1114' and (eventual) tip length 1102'. In step 1304, the bent round wire 100' is flattened (for example by stamping, pressing or rolling) to form a flattened bent wire 100" having a desired flattened length-1112'. In step 1306, the flattened bent wire 100" may have its tip 706 cut to form an angled tip end 808. In step 1308, a plurality of flattened bent wires 100", 100''' are mounted to a substrate (for example in a spider 1250) to partially form a probe card assembly 1260. For example, the flattened bent wires 100", 100''' may be mounted by soldering their respective distal ends 1224 to conductive regions/pads 1222 and adding a ring 1110' and epoxy 1108' to define their beam length portions 1106'. In step 1310, the tip ends 708, 808 may be further defined to form radiused tip ends 1202', 1204'. The tip ends may be so further defined, for example, by repeatedly extending them into a structure 1230 including an abrasive material (as described above). In step 1312, the probe card assembly 1260 may be tested to ensure it meets mechanical/electrical design parameters. In step 1314, an elastomeric material 1242 may be added proximate the ring 1110'/epoxy 1108' to provide additional lateral support for the adjacent flattened probe element wires 100", 100''' to form the probe card assembly 1260'.

As shown in step 1400 of FIG. 14, plated, bent square wire 200' is provided having the desired bend angle 1114" and (eventual) tip length 1102". In step 1402, the bent square wire 200' is flattened (for example by stamping or pressing) to form a flattened bent wire 200" having a desired flattened length 1112". In step 1404, the flattened bent wire 200" may have its tip 906 cut to form an angled tip end 1008. In step 1406, a plurality of flattened bent wires 200", 200''' are mounted to a substrate (for example in a spider 1250) to partially form a probe card assembly 1260. For example, the flattened bent wires 200", 200'''' may be mounted by soldering their respective distal ends 1224 to conductive regions/pads 1222 and adding a ring 1110" and epoxy 1108" to define their beam length portions 1106". In step 1408, the tip ends 908, 1008 may be further defined to form radiused tip ends 1202", 1204". The tip ends may be so further defined by repeatedly extending them into a structure 1230 including an abrasive material (as described above). In step 1410, the probe card assembly 1260 may be tested to ensure it meets mechanical/electrical design parameters. In step 1412, an elastomeric material 1242 may be added proximate the ring 1110'/epoxy 1108' to provide additional lateral support for the adjacent flattened probe element wires 200", 200 to form the probe card assembly 1260'.

As is clear to one skilled in the art, one or more of the steps illustrated in FIGS. 13 and 14 may be deleted or rearranged in order within the scope of the present invention.

The present invention can provide significant advantages over the prior art depending upon the exemplary embodiments. For example, one exemplary advantage may be that there is a greater z-direction height strength thus increasing maximum probe element wire z-direction vertical force. Another exemplary advantage is that higher currents may be possible for a desired pitch without burn out as compared to the same cross-sectional area of a conventional round/square non-flattened probe element wire. A further exemplary advantage is probe card assemblies having an extended life. Yet a further exemplary advantage is that probe card assemblies may be maintained within design parameters for a longer period of use. Another exemplary advantage is decreased variability in the flattened probe element wire tips. Another exemplary advantage is that decreased number of tiers/layers may be utilized for specified pitch densities which decreases variability between the adjacent flattened probe element wires in comparison to conventional probes: Another exemplary advantage is that chemical tip etching and tip grinding may be eliminated to achieve desired tip profiles. Another exemplary advantage is that scraped probe element wires are minimized. Another exemplary advantage is reduction in probe element wire/probe card assembly pitch. Another exemplary advantage is that as the flattened probe element wire tips wear, the diameter of the tips may not change providing for a longer lived probe card assembly. Another exemplary advantage is more uniform final processed (radiused) tips leading to improved contact resistance.

While the exemplary embodiments shown and described herein show cantilever probe element wires, one skilled in the art would be able to apply the teachings of this invention to other probe element wires and structures such as, for example, straight beam members.

In the foregoing specification, embodiments of the invention have been described with reference to numerous specific details that may vary from implementation to implementation. Thus, the sole and exclusive indicator of what is the invention, and is intended by the applicants to be the invention, is the set of claims that issue from this application, in the specific form in which such claims issue, including any subsequent correction. Any definitions expressly set forth herein for terms contained in such claims shall govern the meaning of such terms as used in the claims. Hence, no limitation, element, property, feature, advantage or attribute that is not expressly recited in a claim should limit the scope of such claim in any way. The specification and drawings are, accordingly, to be regarded in an illustrative rather than a restrictive sense.

What is claimed is:

1. A probe card assembly, comprising:
    a substrate whose surface is parallel to an x-y plane, the x-y plane perpendicular to any plane in a z-direction; and
    a plurality of partially flattened probe element wires supported by the substrate, wherein each of the partially flattened probe element wires includes a flattened beam portion and a flattened tip portion extending from the flattened beam portion, wherein the flattened beam portion and the flattened tip portion share a substantially constant thickness to a plane in the z-direction, the height of the flattened beam portion and the flattened tip portion in the z-direction greater than the width of the flattened beam portion and the flattened tip portion that is parallel to the x-y plane.

2. The probe card assembly of claim 1, wherein the substrate is a printed circuit board.

3. The probe card assembly of claim 1, wherein the flattened beam portion comprises about 30% of the total beam length.

4. The probe card assembly of claim 1, wherein a tip of one of the plurality of the partially flattened probe element wires is one of a flat tip, an angled tip or a radiused tip.

5. The probe card assembly of claim 1, wherein the plurality of partially flattened probe element wires are coupled to a respective plurality of conductive regions on the substrate.

6. The probe card assembly of claim 5, further comprising an elastomeric material in contact with the plurality of partially flattened probe element wires for providing support to the plurality of partially flattened probe element wires.

7. The probe card assembly of claim 1, wherein the plurality of partially flattened probe element wires are partially flattened cantilever probe wires.

8. The probe card assembly of claim 1, wherein the tip portion of each adjacent partially flattened probe element wire of the plurality of partially flattened probe element wires are spaced from one another by greater than about 10 μm and less than about 40 μm.

9. The probe card assembly of claim 1, wherein adjacent tip portions of the plurality of partially flattened probe element wires are spaced from one another by greater than about 10 μm.

10. A probe element wire, comprising:
    a partially flattened beam portion; and
    a flattened tip portion extending from the partially flattened beam portion and having a tip,
    wherein the partially flattened beam portion and the flattened tip portion share a substantially constant thickness in a single plane, the tip within the single plane and comprised of the probe element wire.

11. The probe element wire of claim 10, wherein the probe element wire is configured for use with a probe card assembly.

12. The probe element wire of claim 10, wherein the partially flattened beam portion comprises about 30% of the total beam length.

13. The probe element wire of claim 10, wherein the tip is one of a flat tip, an angled tip or a radiused tip.

14. The probe element wire of claim 10, wherein the probe element wire is a cantilever probe wire.

15. A method of processing a probe element wire, comprising the steps of:
    flattening a portion of the probe element wire to form a partially flattened beam portion and a flattened tip portion extending from the partially flattened beam portion and having a tip, wherein the partially flattened beam portion and the flattened tip portion share a substantially constant thickness in a single plane; and
    processing the tip to at least locate the tip within the single plane, the tip comprised of the probe element wire.

16. The method of claim 15, wherein the flattening step comprises at least one of stamping, pressing or rolling at least a portion of the probe element wire.

17. The method of claim 15, wherein the processing step includes at least one of cutting or abrasion of the tip.

18. The method of claim 15, wherein the processing step includes extending at least a portion of the tip into a structure including an abrasive material.

19. The method of claim 15, wherein the processing step includes extending at least a portion of the tip into a structure including an abrasive material and an adhesive material.

20. The method of claim 15, wherein the processing step includes extending at least a portion of the tip into a multi-layered structure that includes at least a first layer of abrasive material and a second layer of adhesive material.

21. The method of claim 15, wherein the flattening step includes flattening a portion of the probe element wire to form the partially flattened beam portion having a flattened beam height of from about 10 to 200% of a non-flattened beam height.

22. The probe card assembly of claim 1, wherein the tip of each of the partially flattened probe element wires is pointed away from the surface of the substrate on which each of the plurality of probe element wires are mounted.

* * * * *